United States Patent
Millas et al.

(10) Patent No.: US 6,881,904 B2
(45) Date of Patent: Apr. 19, 2005

(54) HEAT-SHRINKABLE EMI/RFI SHIELDING MATERIAL

(75) Inventors: Emil Millas, Midlothian, IL (US); Albert Chiapetta, Elmhurst, IL (US); Frank St. John, Rockford, IL (US)

(73) Assignee: Methode Electronics, Inc., Chicago, IL (US)

( * ) Notice: Subject to any disclaimer, the term of this patent is extended or adjusted under 35 U.S.C. 154(b) by 108 days.

(21) Appl. No.: 10/108,517

(22) Filed: Mar. 29, 2002

(65) Prior Publication Data

US 2003/0186602 A1 Oct. 2, 2003

(51) Int. Cl.[7] .................................................. H01B 7/00
(52) U.S. Cl. ................... 174/124 R; 174/1; 174/119 R; 174/119 C; 428/549; 428/570; 428/608; 428/614; 428/615; 428/616; 428/74; 442/49; 442/110; 442/111; 442/117; 442/171; 442/228
(58) Field of Search ................................ 174/1, 119 R, 174/119 C, 124 R; 427/446, 447, 449, 450, 452, 455, 456, 421; 428/549, 570, 608, 614, 615, 616, 74, 75, 76, 457, 458, 920; 442/6, 7, 10, 43, 44, 49, 110, 111, 117, 131, 132, 133, 164, 165, 166, 167, 168, 169, 170, 171, 172, 173, 174, 228, 229, 231, 232, 233, 236, 237, 286

(56) References Cited

U.S. PATENT DOCUMENTS

| | | | |
|---|---|---|---|
| 3,576,387 A | 4/1971 | Derby | 174/36 |
| 4,555,422 A | 11/1985 | Nakamura et al. | 428/36 |
| 4,598,165 A * | 7/1986 | Tsai | 174/36 |
| 4,865,892 A * | 9/1989 | Winfield et al. | 428/34.9 |
| 5,098,753 A | 3/1992 | Gregory et al. | 428/34.9 |
| 5,106,437 A | 4/1992 | Lau et al. | 156/51 |
| 6,005,191 A | 12/1999 | Tzeng et al. | 174/102 |
| 6,410,848 B1 * | 6/2002 | Shrader et al. | 174/36 |
| 2002/0037376 A1 * | 3/2002 | Fenton | 428/34.9 |
| 2003/0124934 A1 * | 7/2003 | Bunyan et al. | 442/226 |

\* cited by examiner

*Primary Examiner*—Arti R. Singh
(74) *Attorney, Agent, or Firm*—Blank Rome LLP

(57) ABSTRACT

The present invention relates to a material for shielding electromagnetic interference (EMI) and radio frequency interference (RFI) between a, electrical conductor or bundle of conductors and the environment. The material comprises a heat-shrinkable woven fabric coated with a conductive material. Specifically, the material can be used as a jacket heat-shrinkable to fit with any sized wire, cable, data or signal line, antenna, or other electrical conductor. A method of making the material is also discussed. In the method, a heat-shrinkable woven fabric is coated with a conductive slurry. When the slurry is dried, a conductive material is deposited on the surface of the heat-shrinkable woven fabric.

5 Claims, 8 Drawing Sheets

HEAT-SHRINKABLE EMI/RFI SHIELDING MATERIAL

FIELD OF THE INVENTION

The present invention relates to a material for shielding electromagnetic interference (EMI) and radio frequency interference (RFI) between an electrical conductor or bundle of conductors and the environment. Specifically, the material of the present invention is heat-shrinkable to fit with any sized wire, cable, data or signal line, antenna, or other electrical conductor. The shielding material of the present invention can also be used with non-tubular, irregularly shaped electronic devices.

BACKGROUND OF THE INVENTION

Modern electronic devices generates electromagnetic radiation with the electronic circuitry and transmission lines of the equipment. The radiation often develops as a field or as transients within the radio frequency band of the electromagnetic spectrum, i.e., between about 10 kHz and 10 GHz, and is termed "electromagnetic interference" or "EMI." This radiation is known to interfere with the operation of other proximate electronic devices.

To mitigate EMI effects, shieldings having the capability of absorbing and/or reflecting EMI energy may be employed to confine the EMI energy within a source device and to insulate that device or other target devices from other source devices. The shielding provides a barrier that is inserted between the source and other target devices. The shield typically is an electrically conductive housing that is grounded. For electrical wire, cable, cord or other conductor, EMI shielding is often provided by enclosing the conductor within an electrically conductive conduit or housing.

A less cumbersome shielding can be accomplished by covering the wire or cable with a shielding layer woven or braided of a metal wire or other electrically conductive fibers. For example, U.S. Pat. No. 5,483,020 to Hardie et al. discloses a cable having parallel conductors surrounded by an insulating layer. The cable is then EMI shielded by a braided metal shield of a plated electrical conductor.

U.S. Pat. No. 5,477,011 Singles et al. discloses a low-noise signal transmission cable that employs an insulative layer that is bonded to a surrounding shield layer via an adhesive. The shield may be a braided metal, conductive polymer, or wrapped foil layer.

U.S. Pat. No. 5,293,001 to Gebs discloses a flexible, shielded cable assembly. The assembly includes a flexible metal conductor, a dielectric layer positioned about the conductor, and a flexible metallic shield disposed about the dielectric. The shield preferably employs a thin metallic foil and a metallic braid, ribbon, or tape disposed about the foil.

U.S. Pat. No. 5,043,530 to Davies discloses a shield cable which includes an internal conductive core with 1-4 wire leads, each of which are insulated with a wrapping of an insulative tape. The voids between the leads are filled with an amorphous elastomer. A shield layer is provided by braiding a silver-copper alloy wire over the elastomer-covered conductive core. The strands of the shield become embedded in the elastomeric material which thereby fills the spaces in the braided structure. A barrier of an insulative jacket surrounds the elastomer-covered shield and conductive core.

U.S. Pat. No. 5,015,800 Vaupotic et al., discloses a controlled impedance transmission line that consists of a flexible cable having a side-by-side pair of conductors. The conductors are surrounded by respective inner and outer dielectric layers. A braided wire shield surrounds the dielectric layers, which shield, in turn, is surrounded and penetrated by an exterior jacket.

U.S. Pat. No. 4,639,545 to Pithouse et al. discloses a conductor that is surrounded by a dielectric. A fabric in the form of a tubular sleeve is woven or positioned around the conductor. The fabric may include a conductive metal warp and a recoverable polymeric weft, which weft is recovered to secure the fabric through engagement with the dielectric.

U.S. Pat. No. 4,376,229 to Maul et al. discloses a flexible, shielded electrical conduit. The conduit includes a flexible tubing, a flexible electrical shielding disposed within the tubing, and an axially compressed, radially expanded elastic woven retainer which forces the shielding into continuous contact with the tubing. The shielding may be provided as a weave of electrically conductive filaments.

Proposals have been made to provide shielding for wires, cables, lines, and the like in the form of a tubular, heat-shrinkable outer layer within which is received a conductive inner layer. For example, U.S. Pat. No. 3,576,387 to Derby discloses a heat-shrinkable shield formed of an outer layer of a heat-shrinkable tubing having a thin layer of a metal-filled polymeric matrix bonded to the inner surface thereof. The shield may be sheathed over an insulated wire or cable, and then heated to shrink the outer layer of the shield over the insulation of the wire or cable.

U.S. Pat. No. 5,106,437 to Lau et al. discloses a conformable electromagnetic radiation suppression cover for a reflecting structure. The cover includes a tubular outer layer of an electromagnetic radiation absorber formed of a non-conductive composite with one or more kinds of dissipative particles dispersed in a shrinkable dielectric binder. An inner sealant layer is employed to fill any voids between the absorber and the structure. A thin metallic foil may be bonded between the sealant and the absorber as a ground plane.

U.S. Pat. No. 4,555,422 to Nakamura et al. discloses a magnetic shielding article that includes a heat-shrinkable outer layer of a thermoplastic polymeric material and an inner layer of a magnetic shielding layer. The shielding layer may be formed of a thermoplastic material filled with a powdered ferrite.

U.S. Pat. No. 4,915,139 to Landry et al. discloses another heat-shrinkable tubing article. Such article is formed of an outer layer of a tubular, heat-deformable material having a thermoplastic melt liner that is bonded to the inner surface thereof. A fiber reinforcement layer is disposed between the melt liner and the shrink tubing.

U.S. Pat. No. 6,005,191 to Tzeng et al. discloses a heat shrinkable jacket for EMI shielding. The jacket comprises a conductive inner layer, a thermoplastic interlayer, and a heat shrinkable outer layer. The thermoplastic interlayer bonds the conductive inner layer to the heat shrinkable outer layer when the jacket is heated. The conductive inner layer can be a nonconductive fabric and a conductive metal foil formed of copper, aluminum, or another metal, or as a combination or blend of conductive and nonconductive fibers.

A representative commercial heat-shrinkable tubing shielding is marketed under the name CHO-SHRINK® by the Chomerics Division of Parker Hannifin Corp., Woburn, Mass. The shielding is formed by coating a conductive compound onto the outer surface of a heat-shrinkable tube. Another such product is manufactured by Raychem Corp., Menlo Park, Calif., as a heat-shrinkable tube electroplated with an outer layer of a conductive metal.

SUMMARY OF THE INVENTION

An object of the present invention is to provide an improved EMI/RFI shielding material that is flexible and easy to manufacture, provides significant weight savings, and can be trimmed simply, without requiring special equipment.

A further object of the present invention is to provide a heat-shrinkable EMI/RFI shielding material that is capable of conforming to the shape of the object being shielded.

The shielding material of the present invention comprises a heat-shrinkable woven fabric that is coated with a conductive material. The conductive material can be silver, nickel, zinc, cobalt, tin, lead, platinum, gold, carbon, graphite, or alloys and mixtures thereof.

A further object of the present invention is to provide methods of making the heat-shrinkable EMI/RFI shielding material. The method comprises 1) providing a heat shrinkable woven fabric, 2) coating the heat-shrinkable fabric with a conductive slurry; and 3) drying the conductive slurry. After the drying step, a conductive substance remains on the surface and, preferably, the interior, of the heat-shrinkable woven fabric to produce an EMI/RFI shielding material that is capable of conforming to the shape of the object being shielded.

BRIEF DESCRIPTION OF THE FIGURES

The following detailed description of the preferred embodiment of the invention will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF THE PREFERRED EMBODIMENTS OF THE INVENTION

Figure 1:
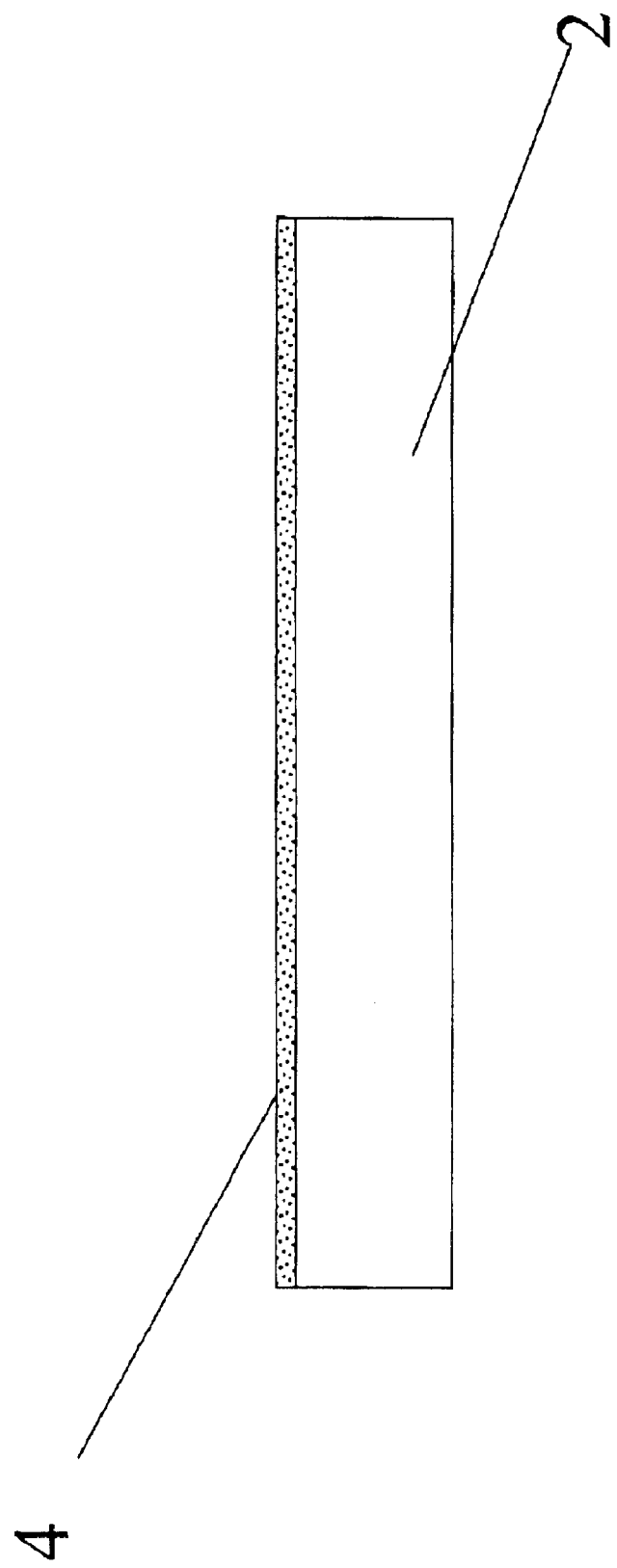
FIG. 1 shows the embodiment of the invention where the conductive substance is applied only on one surface of the heat-shrinkable woven fabric.

In the drawings, like numerals are used to indicate like elements throughout. Certain terminology is used for convenience only and is not limiting. The words "top" and "bottom" designate directions in the drawings to which reference is made, but are not intended as limitations on the scope of the invention.

Figure 2:
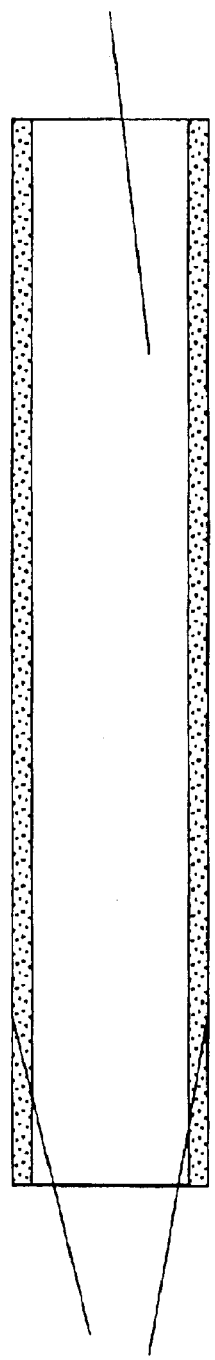
FIG. 2 shows the embodiment of the invention where the conductive substance is applied on both surfaces of the heat-shrinkable woven fabric.

A first embodiment of the invention is depicted in FIG. 1, which shows a heat-shrinkable woven fabric 2 with a conductive substance 4 on the top surface. A second embodiment is depicted in FIG. 2, which shows a heat-shrinkable woven fabric 2 with a conductive substance 4 on the top and bottom surfaces.

Figure 3:
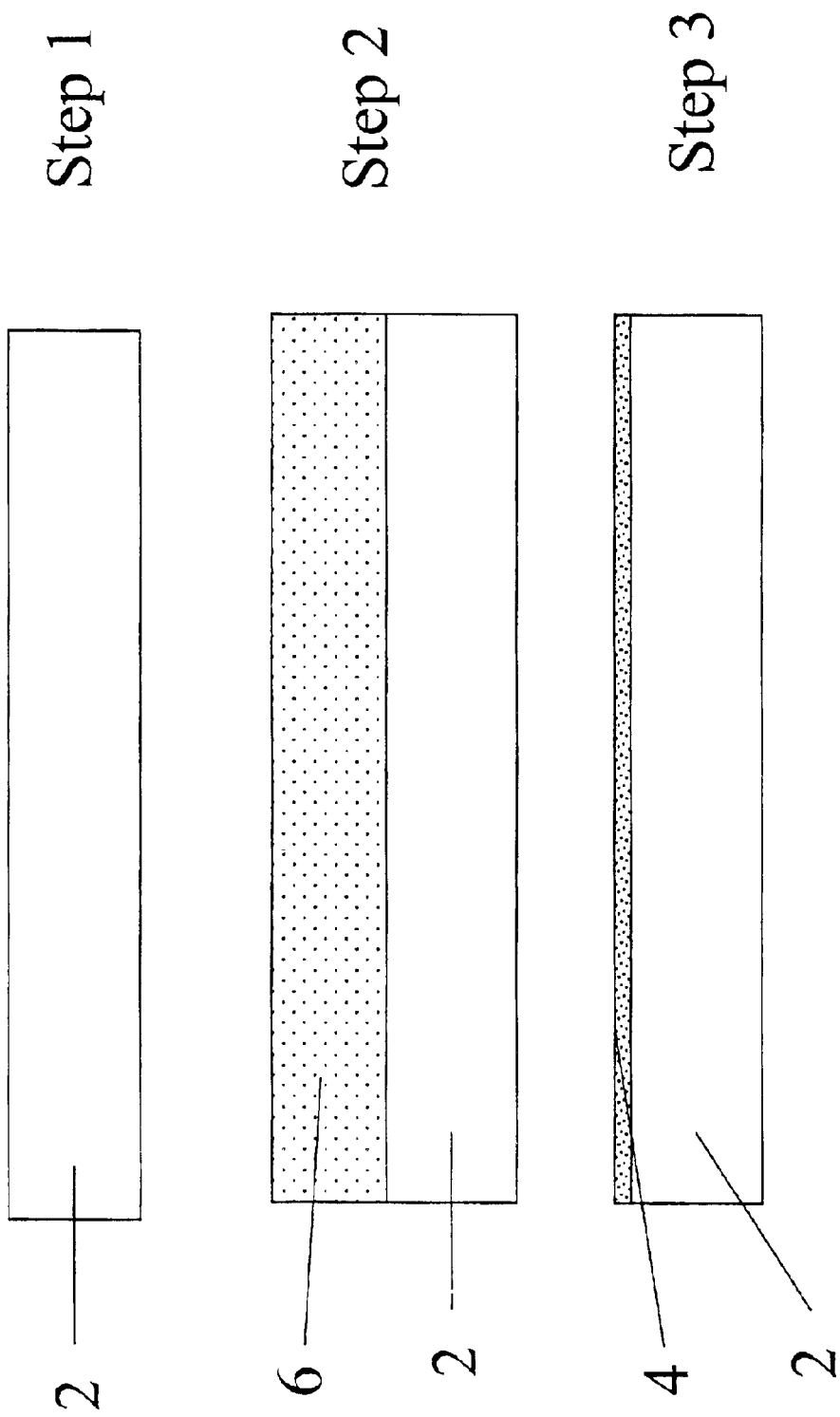
FIG. 3 shows the method of making the EMI/RFI material where the conductive slurry is applied to only one surface of the heat-shrinkable woven fabric.
Figure 4:
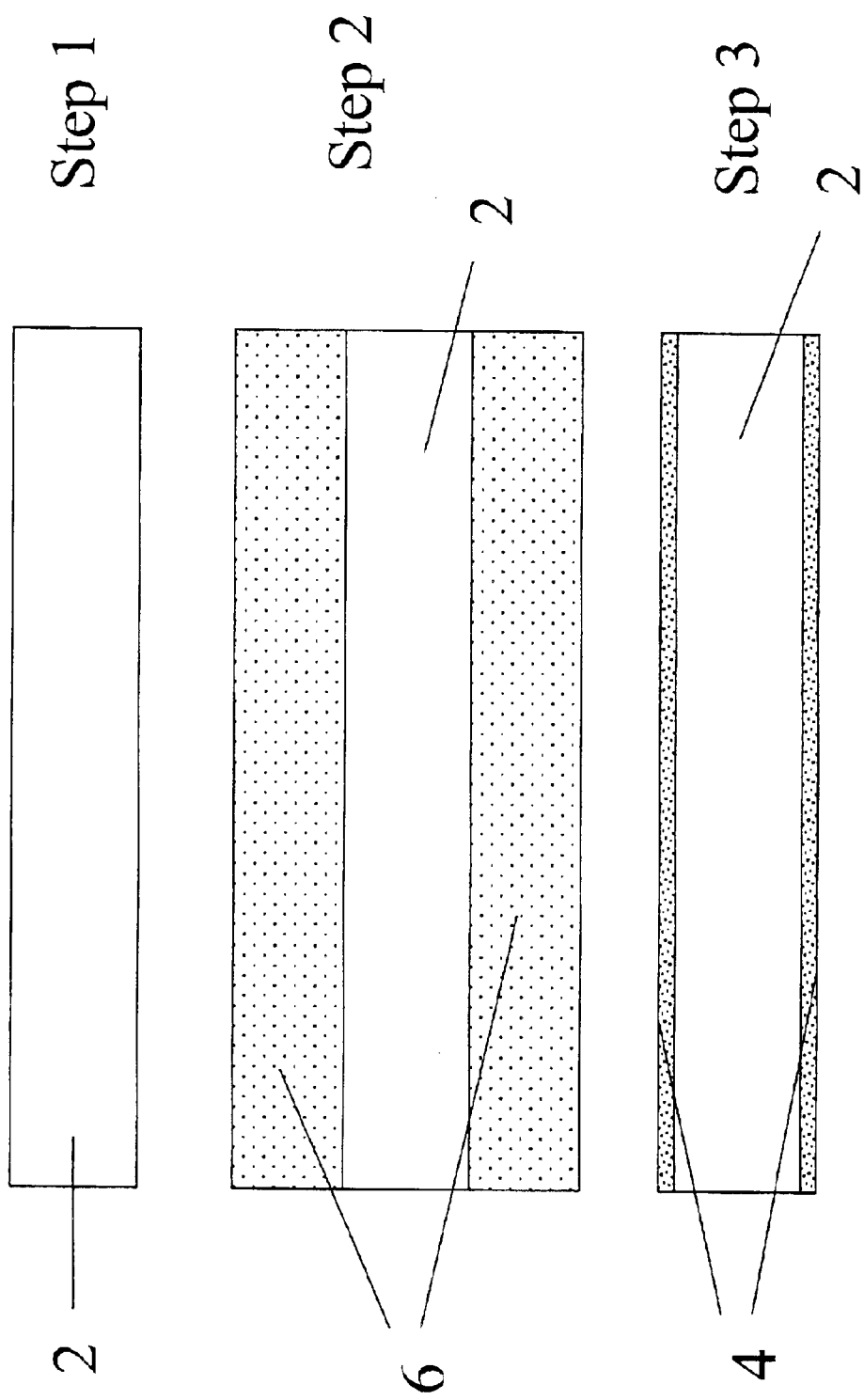
FIG. 4 shows the method of making the EMI/RFI material where the conductive slurry is applied to both surfaces of the heat-shrinkable woven fabric.
Figure 5:
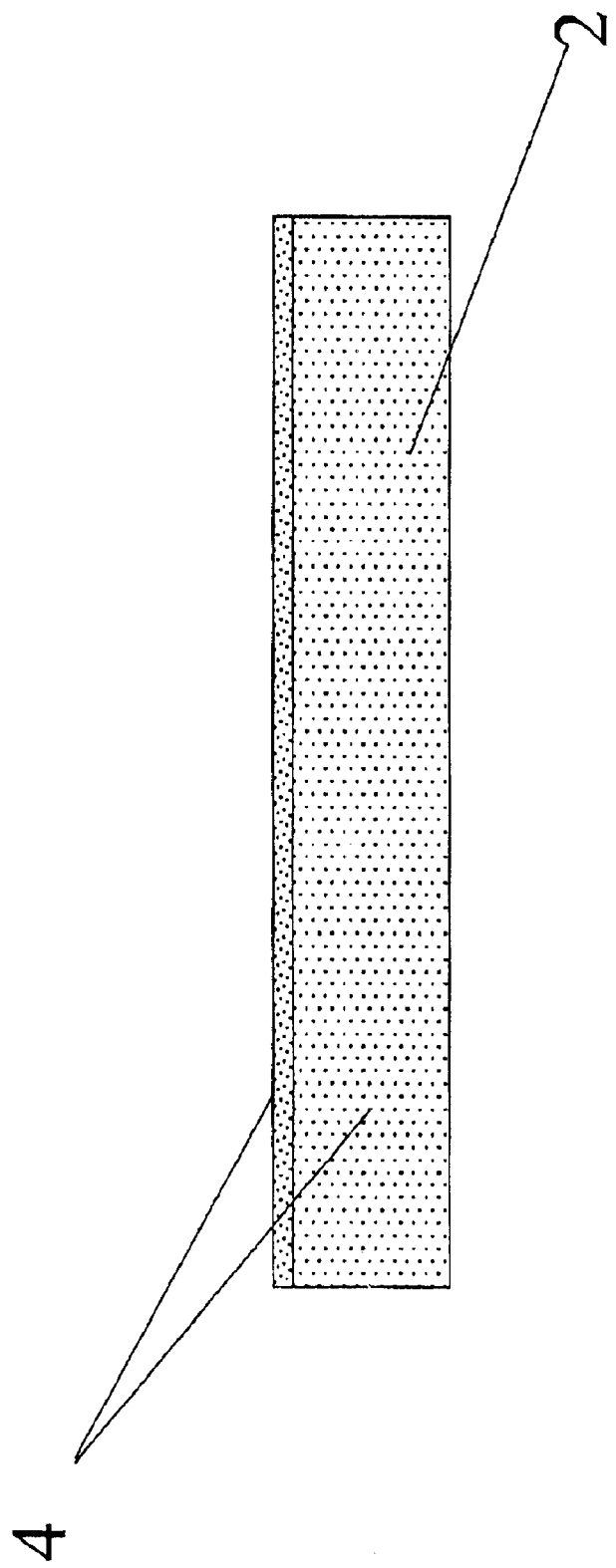
FIG. 5 shows the embodiment of the invention where the conductive substance is located on the surface and is absorbed into the interior of the heat-shrinkable woven fabric.

The conductive substance 4 is deposited directly on the surface(s) of the heat-shrinkable woven fabric. FIGS. 3 and 4 describe the steps involved in the coating process for the first and the second embodiments, respectively. The process comprises the steps of 1) providing a heat-shrinkable woven fabric 2, 2) coating the heat-shrinkable woven fabric 2 with a conductive slurry 6, and 3) drying the conductive slurry 6 to leave a conductive substance 4 on the surface(s) of the heat-shrinkable woven fabric 2. In a preferred embodiment, the woven fabric is sufficiently porous that the slurry is absorbed into the fabric. Upon drying, the conductor not only coats the surface(s) of the fabric, but also the pores and gaps in the interior of the woven fabric. This preferred embodiment is illustrated in FIG. 5, where the conductive substance 4 is located on the surface and within the heat-shrinkable woven fabric 2.

The heat-shrinkable fabric 2 of the present invention is preferably woven from strands of polymeric materials characterized as heat-shrinkable. These polymeric materials include, but are not limited to, rubbers such as neoprene and silicone; oriented amorphous or crystalline thermoplastics including polyolefins such as polyethylene, polypropylene, polystyrene, and the like; vinyls such as polyvinyl chloride and polyvinyl acetate; polyamides; fluoropolymers such as polytetrafluoroethylene; polyesters such as polyethylene terephthalate; and copolymers and blends thereof. Preferred materials are polyolefin and polyester. In general, materials of such type exhibit plastic memory. When the material is cross-linked, oriented, or otherwise residually stressed into an expanded shape, it is sufficiently elastic to contract, constrict, or shrink to recover to a pre-expanded shape when raised to a predetermined temperature allowing intra-chain movement and the release of the residual stresses. For example, the material may inherently possess sufficient crystallinity to exhibit the desired thermal response, or may require cross-linking or the addition of another polymer or copolymer to exhibit the desired response. The "shrink" temperature should be above normal room temperature of about 25° C., and typically will be between about 95–225° C. Examples of heat shrinkable materials may be found in U.S. Pat. Nos. 2,027,962 and 3,086,242, both to Cook et al., the disclosures of which are incorporated herein by reference. The slurry 6 used to coat the heat-shrinkable woven fabric 2 comprises a conductor, preferably in powder or particulate form. The conductor can be metals or non-metals. The metals can be, but are not limited to, silver, nickel, zinc, cobalt, tin, lead, platinum, gold, and alloys and mixtures thereof. Appropriate non-metals can be, but is not limited to, carbon and graphite. Mixtures of the metals and non-metals are also appropriate conductor for the application of the present invention. The slurry 6 can also comprise resins, solvents, and additives such as plasticizers, antioxidants, and flexibilizers. The resins can be, but are not limited to, acrylic, vinyl, polyester, urethane, and cellulose resins. The solvents can be, but are not limited to, alcohols such as iso-propyl alcohol, texanol, cyclohexanol, etc.; esters such as glycol ether DB acetate, ethyl acetate, n-butyl acetate, etc.; glycol ethers such as ethylene glycol methyl ether, ethylene glycol ethyl ether, ethylene glycol n-butyl ether, etc.; ketones such as acetone, isophorone, methyl ethyl keytone, etc.; terpenes such as alpha terpineol, pine oil, turpentine, etc.; naphthas such as stoddard solvent, mineral spirits, kerosene, etc.; cyclic hydrocarbons such as benzene, toluene, xylene, etc.; and mixtures thereof The additives can be, but are not limited to, phthalates such as benzyl butyl phthalate and dibutyl phthalate, and mineral oil. A preferred slurry comprises 40–60% (wiw) conductor, 5–20% (w/w) resin, 30–50% (w/w) solvent, and 0–5% (w/w) additive(s). The preferred conductor, resin, solvent, and additive are silver, acrylic resin, toluerie, and benzyl butyl phthalate. Most preferably, the slurry comprises 10-15 % (w/w) acrylic resin, 5–15% stoddard solvent, 18–28% toluene, 41–51% (w/w) silver, and 0–2% (w/w) benzyl butyl phthalate.

The conductive slurry can be applied to the heat-shrinkable woven fabric by any known method such as knife coating, roller coating, spraying, dipping, brushing, printing, or combinations thereof. Alternatively, the slurry can be poured over the heat-shrinkable woven fabric and allowed to dry. The method of application is generally chosen based on the process economics and the viscosity of the slurry.

In a preferred embodiment of the invention, the EMI/RFI shielding material is prepared as a tube to be used as a shielding jacket for cable, wire, antenna, or other electrical conductor or elongated article. The tube is generally formed from a planar sheet of heat-shrinkable woven fabric by rolling the fabric into a cylinder and gluing or otherwise attaching the edges together.

The slurry can be applied to the fabric before or after tubular formation. For application after tubular formation, the slurry can be sprayed into the tube. Alternatively, the tube can be filled with the slurry; and then the excess conductive slurry is allowed to flow out of the tube leaving a film of the slurry on the inside surface of the tube. The outside of the tube can also be coated as well if necessary. If both sides of the tube are to be coated, dipping is the preferred method of applying the slurry to the heat-shrinkable woven fabric.

Figure 6:
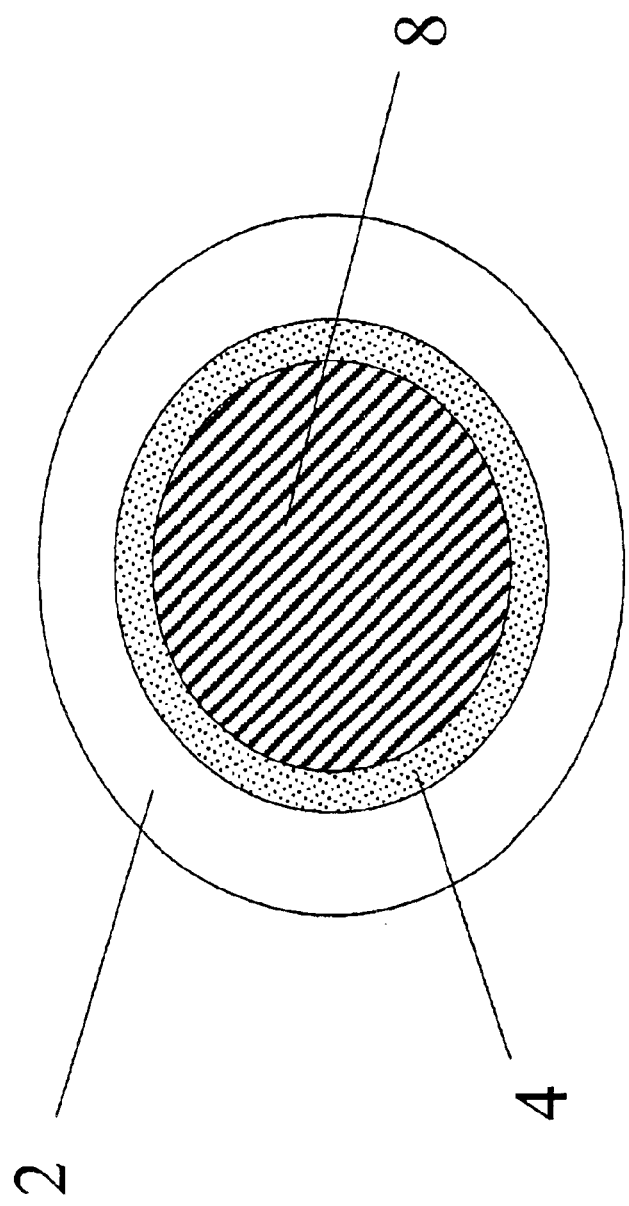
FIG. 6 shows the use of the EMI/RFI material for shielding a cable where the material has only one surface covered with the conductive substance.
Figure 7:
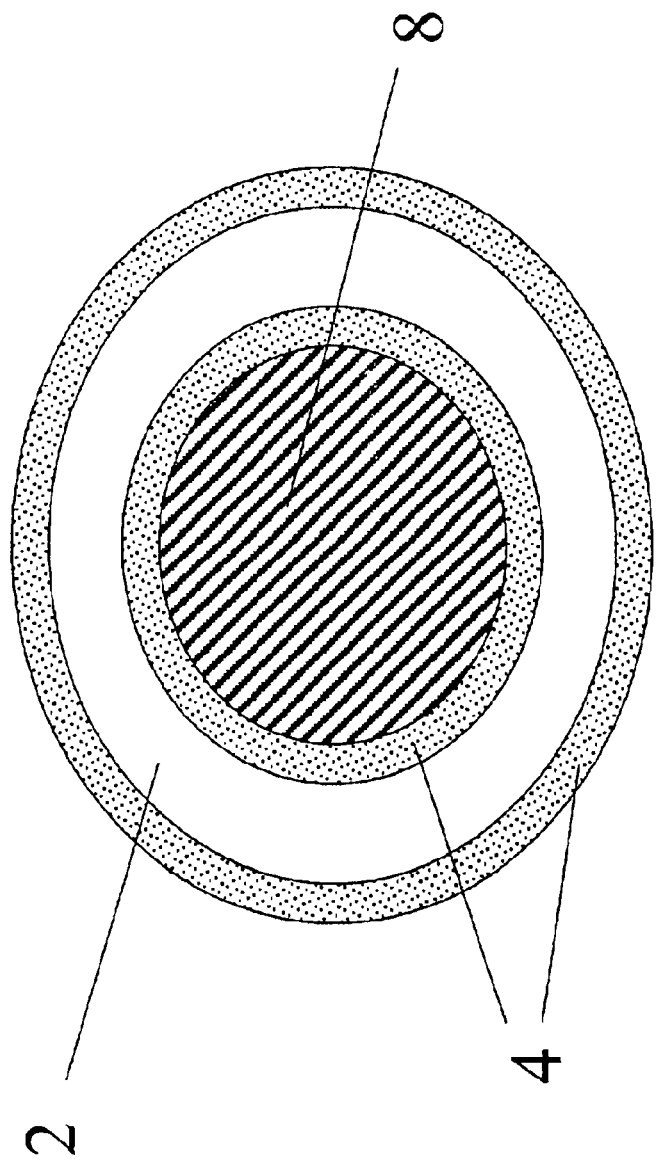
FIG. 7 shows the use of the EMI/RFI material for shielding a cable where the material has both surfaces covered with the conductive substance.
Figure 8:
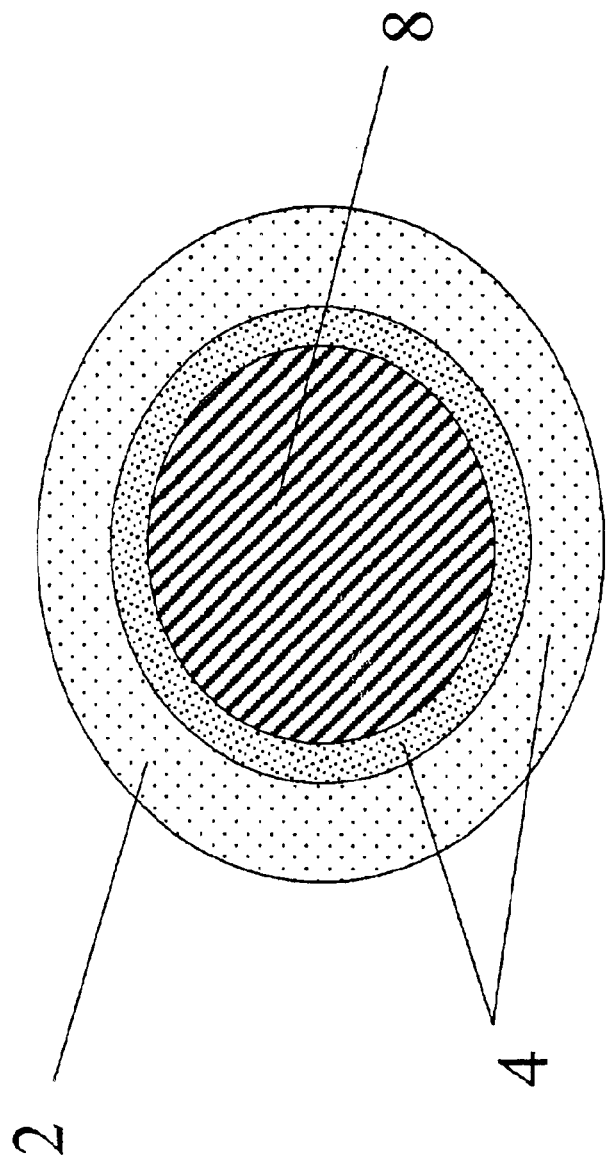
FIG. 8 shows the use of the EMI/RFI material for shielding a cable where the conductive substance is located on the surface and within the heat-shrinkable woven fabric.

FIGS. 6, 7, and 8 show the use of the tubular EMI/RFI shielding material on a cable. FIG. 6 shows the EMI/RFI shielding with the conductive substance 4 on the inside of the tubular heat-shrinkable woven fabric 2. The tubular shielding material covers a cable 8 to shield the cable from external EMI/RFI, and to shield the environment from EMI/RFI from the cable. FIG. 7 shows the tubular shielding with both the inner and outer surfaces coated with the conductive substance 4. FIG. 8 shows the tubular shielding where the heat-shrinkable woven fabric 2 is sufficient porous to absorb the slurry such that the conductive substance 4 is also deposited inside the fabric itself. In the case of the tubular configuration, the EMI/RFI shielding tube is placed around a cable, wire, antenna, or other electrical conductor or elongated article. The tube is then heated to shrink the heat-shrinkable woven material to a tight fit around the cable, wire, antenna, or other electrical conductor or elongated article.

EXAMPLE 1

A slurry was mixed to homogeneity using the proportions depicted in Table 1.

TABLE 1

| | |
|---|---|
| F-10 acrylic resin from Rohm & Haas | 130 grams |
| Toluene | 100 grams |
| 7E silver from Degussa | 200 grams |
| Santicizer 160 from Ferro Corp. | 2 grams |
| Total | 432 grams |

First, the liquid components were added and mixed to homogeneity using a mixer such as a Banbury mixer. The solid component (silver) are then added to the liquid mixture and stirred so that the solid particles are evenly distributed throughout. An EMI/RFI shielding was made by dipping a heat-shrinkable woven fabric into the slurry followed by air drying.

The present invention has a major advantage over the prior art in that the woven fabric provides a more flexible material that is able to conform around irregularly shaped electrical instruments and apparatuses. Further, the fabric absorbs the slurry so that upon drying, the conductive material are not only located on the surface of the fabric, but also in between the strands of the fabric, which results in a superior performing shield.

The invention has been disclosed broadly and illustrated in reference to representative embodiments described above. Those skilled in the art will recognize that various modifications can be made to the present invention without departing from the spirit and scope thereof.

What is claimed is:

1. An EMI/RFI shielding material, comprising:
   a heat-shrinkable woven fabric having opposite first and second surfaces and a plurality of pores, said heat-shrinkable woven fabric being non-conductive; and
   a conductive coating layer formed on one of said first and second surfaces of said heat-shrinkable woven fabric.

2. An EMI/RFI shielding material according to claim 1, wherein
   said coating layer is disposed in said plurality of pores of said heat-shrinkable woven fabric.

3. An EMI/RFI shielding material according to claim 1, wherein
   said coating layer is disposed on both of said first and second surfaces of said heat-shrinkable woven fabric.

4. An EMI/RFI shielding material according to claim 1, wherein
   said coating layer coats substantially all of said heat-shrinkable woven fabric.

5. An EMI/RFI shielding material according to claim 1, wherein
   said heat-shrinkable woven fabric is formed of a rubber material.

* * * * *